United States Patent
Cai

(10) Patent No.: US 9,316,925 B2
(45) Date of Patent: Apr. 19, 2016

(54) METHODS FOR MONITORING SOURCE SYMMETRY OF PHOTOLITHOGRAPHY SYSTEMS

(71) Applicant: Semiconductor Manufacturing International (Shanghai) Corporation, Shanghai (CN)

(72) Inventor: Boxiu Cai, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 204 days.

(21) Appl. No.: 14/078,836

(22) Filed: Nov. 13, 2013

(65) Prior Publication Data

US 2014/0362363 A1   Dec. 11, 2014

(30) Foreign Application Priority Data

Jun. 5, 2013  (CN) .......................... 2013 1 0224037

(51) Int. Cl.
*G03B 27/32* (2006.01)
*G03F 7/20* (2006.01)

(52) U.S. Cl.
CPC ........ *G03F 7/70633* (2013.01); *G03F 7/70133* (2013.01)

(58) Field of Classification Search
CPC . G03F 7/70633; G03F 7/706; G03F 7/70133; G03F 7/70591
USPC ....................................................... 355/75, 52
See application file for complete search history.

(56) References Cited

U.S. PATENT DOCUMENTS

2007/0002293 A1* 1/2007 Park et al. ........................ 355/52
2007/0279607 A1* 12/2007 Smith et al. ..................... 355/52

* cited by examiner

*Primary Examiner* — Peter B Kim
(74) *Attorney, Agent, or Firm* — Anova Law Group, PLLC

(57) ABSTRACT

A method for monitoring the source symmetry of a photolithography system is provided. The method includes providing a first reticle; and providing a second reticle. The method also includes forming first bottom overlay alignment marks on a first wafer using the first reticle; and forming first top overlay alignment marks on the first bottom overlay alignment marks using the second reticle. Further, the method includes forming second bottom overlay alignment marks on a second wafer using the first reticle; and forming second top overlay alignment marks on the second bottom overlay alignment marks using the second reticle. Further, the method also include measuring a first overlay shift; measuring a second overlay shift; and obtaining an overlay shift caused by the source asymmetry based on the first overlay shift and the second overlay shift.

20 Claims, 8 Drawing Sheets

METHODS FOR MONITORING SOURCE SYMMETRY OF PHOTOLITHOGRAPHY SYSTEMS

CROSS-REFERENCES TO RELATED APPLICATIONS

This application claims the priority of Chinese patent application No. 201310224037.8, filed on Jun. 5, 2013, the entirety of which is incorporated herein by reference.

FIELD OF THE INVENTION

The present invention generally relates to the field of semiconductor technology and, more particularly, relates to monitoring methods for source symmetry of photolithography systems.

BACKGROUND

In the development of integrated circuit (IC) manufacturing technology, photolithography has always been a major technology of semiconductor patterning. Various patterns on a reticle may be sequentially imaged onto a photoresist layer on a wafer by a photolithography system with a precise alignment. After developing, desired patterns may be formed on the wafer. Because an IC may include a plurality of layers of circuit structures stacking together, an alignment accuracy of every circuit layer and adjacent circuit layers may need to be ensured. If the alignment accuracy is beyond a predetermined range, it may cause the entire IC to be unable to achieve the design target.

Overlay is a parameter used to evaluate an alignment status of patterns formed by a current process layer and patterns formed by a previous process layer. In an IC manufacturing process, the alignment accuracy of a current process layer and the alignment accuracy of a previous process layer may be measured. If a positioning error exists between an exposure layer of the current process layer and an exposure layer of the previous process layer, an overlay error may be formed. In order to monitor and calibrate an alignment status of patterns formed by the previous process layer and patterns formed by the current process layer, overlay marks may often by formed with device patterns simultaneously; and the overlay error may be obtained by measuring the overlay marks formed by different process layers.

The overlay marks may be formed in scribe lines of different process layers. Specifically, a process for forming the overlay marks may include sequentially forming an outer overlay mark at a first position on a first process layer; forming an inner overlay mark at a same position (the first position) on a second process layer to align with the outer overlay mark on the first process layer; and forming another outer overlay mark at a second position on the second process layer used to align with another inner overlay mark on a subsequent third process layer.

In a photolithography system, a source asymmetry may be caused by an unaligned laser, usage life span of a pupil and/or diffracting optical electronic (DOE) devices, etc. The source asymmetry may be a major reason causing an overlay shift of a photolithography process. In order to ensure an alignment accuracy of the photolithography system, and reduce overlay errors, the source asymmetry may need to be monitored.

However, the existing technology for monitoring the source symmetry (or asymmetry) may be based on scanning and imaging the source by charge-coupled-detector (CCD) sensors. Such monitoring technology is a complex off-line monitoring process; and may affect a normal manufacturing process. The disclosed methods and systems are directed to solve one or more problems set forth above and other problems.

BRIEF SUMMARY OF THE DISCLOSURE

The present disclosure includes a method for monitoring the source symmetry of a photolithography system. The method includes providing a first reticle; and providing a second reticle. The method also includes forming first bottom overlay alignment marks on a first wafer using the first reticle; and forming first top overlay alignment marks on the first bottom overlay alignment marks using the second reticle. Further, the method includes forming second bottom overlay alignment marks on a second wafer using the first reticle; and forming second top overlay alignment marks on the second bottom overlay alignment marks using the second reticle. Further, the method also include measuring a first overlay shift; measuring a second overlay shift; and obtaining an overlay shift caused by the source asymmetry based on the first overlay shift and the second overlay shift.

Other aspects of the present disclosure can be understood by those skilled in the art in light of the description, the claims, and the drawings of the present disclosure.

BRIEF DESCRIPTION OF THE DRAWINGS

FIGS. 2-7 illustrate structures and steps corresponding to certain stages of the monitoring method.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
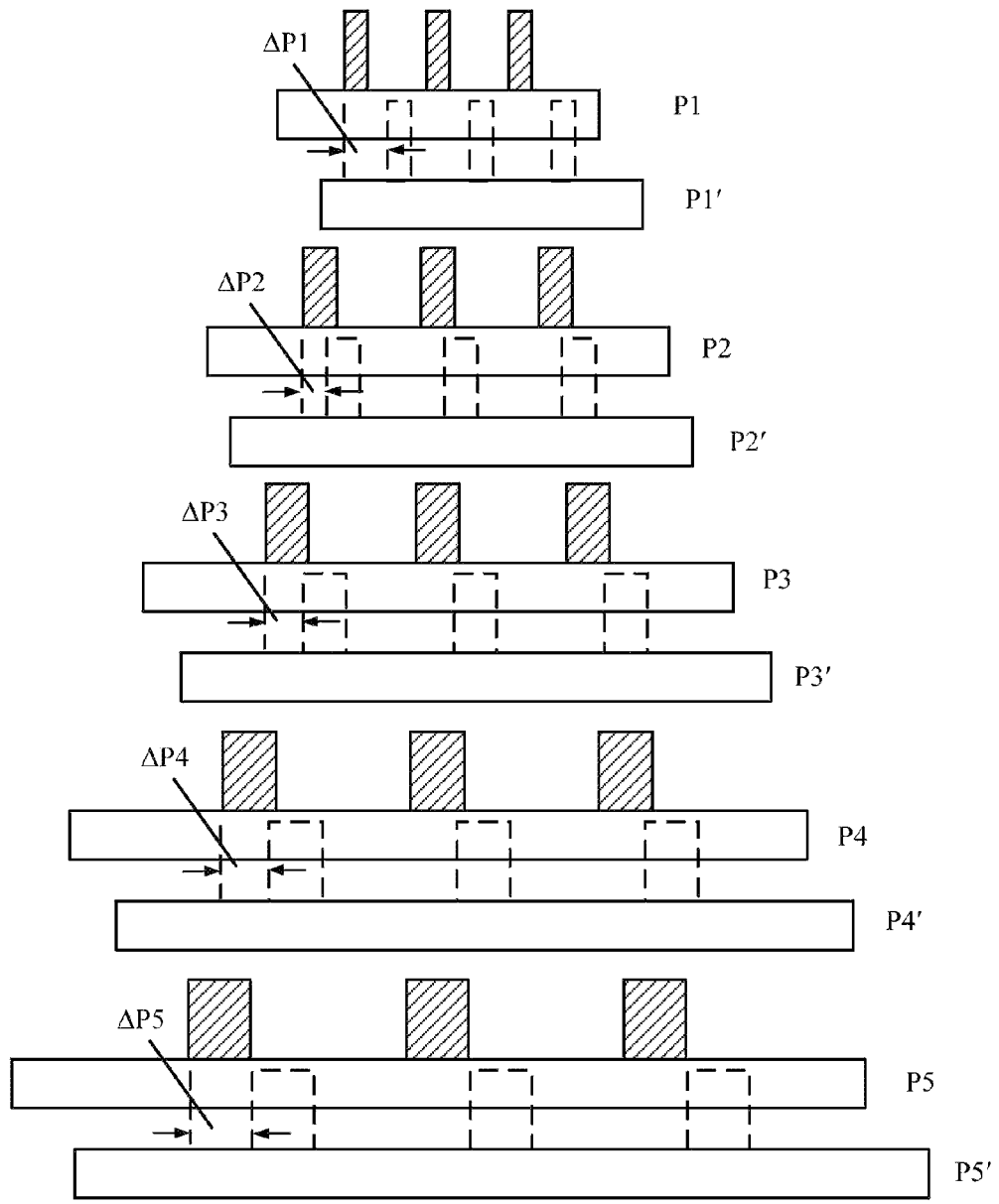
FIG. 1 illustrates positions of patterns with different pitches formed by an asymmetrical source.

In an existing photolithography process, a source (scanner pupil and/or diffractive optical elements) asymmetry may cause patterns formed by the photolithography process to shift; and the shift may depend on pitches of the patterns on a reticle. FIG. 1 illustrates positions of patterns with different pitches formed by an asymmetrical source.

As shown in FIG. 1, P1, P2, P3, P4 and P5 may be the positions of patterns with different pitches formed by an asymmetrical source; P1', P2', P3', P4' and P5' may the positions of patterns formed by a symmetrical source; and $\Delta P1$, $\Delta P2$, $\Delta P3$, $\Delta P4$ and $\Delta P5$ may be shifts of the patterns formed by the asymmetric source and the symmetric source. As shown in FIG. 1, ΔP1, ΔP2, ΔP3, ΔP4 and ΔP5 may be dependent of the pitches of the patterns. Because the shifts of the patterns caused by the asymmetrical source may be dependent of the pitches of the patterns, the symmetry of the source may be monitored by monitoring the shifts of the patterns with different pitches.

Figure 9:
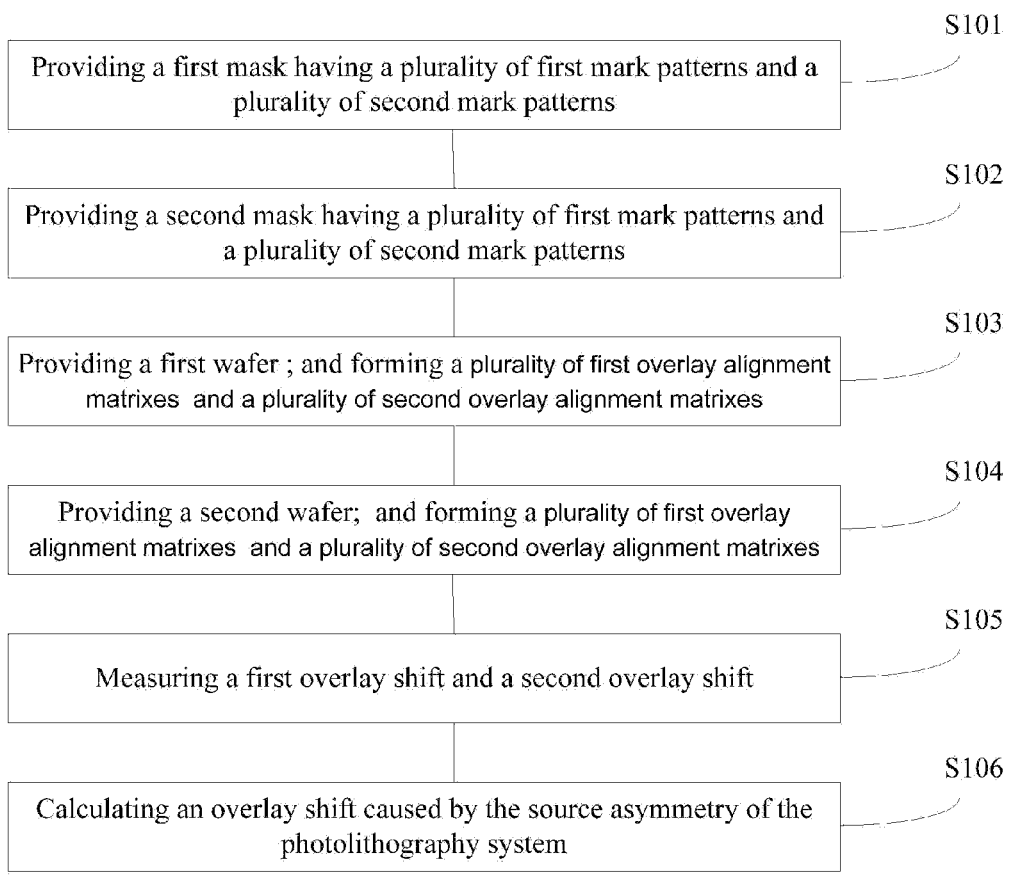
FIG. 9 illustrates a method for monitoring the source symmetry of a photolithography system consistent with disclosed embodiments.

FIG. 9 illustrates a method for monitoring the source symmetry of a photolithography system consistent with disclosed embodiments; and FIGS. 2-7 illustrate structures and steps corresponding certain stages of the monitoring method.

Figure 2:
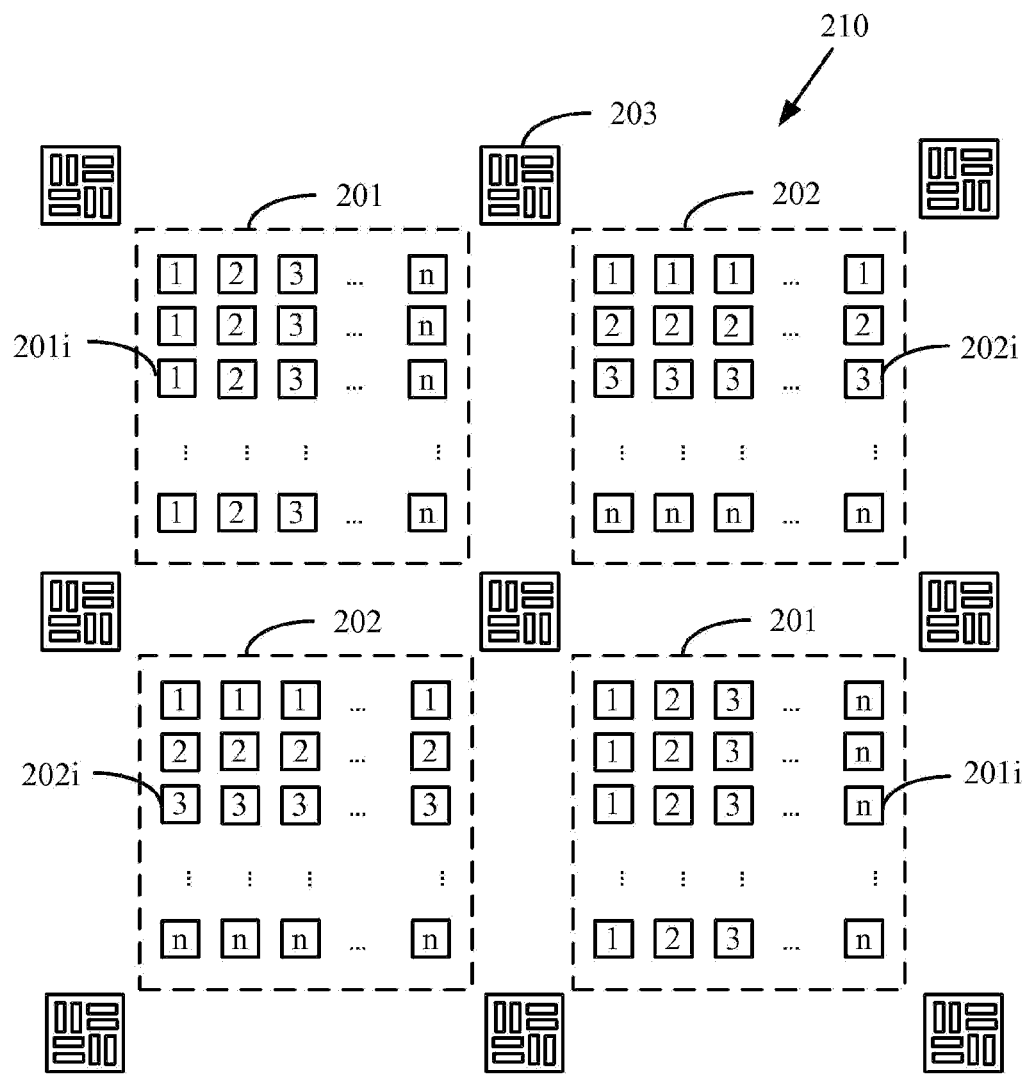
FIG. 2 illustrates a first reticle consistent with the disclosed embodiments.

As shown in FIG. 9, the monitoring method may firstly include providing a first reticle with certain structures (S101). FIG. 2 illustrates a corresponding structure.

As show the FIG. 2, a first reticle 210 is provided. The first reticle 210 may have a plurality of first mark patterns 201 (may refer to an odd function area) and a plurality of second mark patterns 202 (may refer to an even function area). The first mark patterns 201 and the second mark patterns 202 may have a plurality of sub patterns distributed in rows and columns. Pitches of the rows of the second mark patterns 202 may be equal to pitches of the columns of the first mark patterns 201. Pitches of the rows of the second mark patterns 202 may also be different from pitches of the columns of the first mark patterns 201.

In one embodiment, the first reticle 210 may include two first mark patterns 201 and two second mark patterns 202. The two first mark patterns 201 and the two second mark patterned may be diagonally distributed. That is, the two first mark patterns 201 may locate at both ends of a first diagonal of an imaginary square; and the two second mark patterns 202 may locate at both ends of the second diagonal of the imaginary square. Specifically, as shown in FIG. 2, the two first mark patterns 201 may locate at the top-left corner and the bottom-right corner of the imaginary square; and the two second mark patterns 202 may locate at the top-right corner and the bottom-left corner of the imaginary square. In certain other embodiments, positions of the first mark patterns 201 and the second mark patterns 202 may be switched.

In certain other embodiments, a number of the first mark patterns 201 and a number of the second mark patterns 202 may be greater than two. The number of the first mark patterns 201 and the number of the second mark patterns may be equal, or different.

Further, as shown in FIG. 2, the first mark patterns 201 may include an "n×n" array of sub patterns 201$i$ (wherein "n" is a positive integer). The "n×n" array may refer to a number of "n×n" sub patterns 201 are distributed in "n" rows and "n" columns. Pitches of the sub patterns 201$i$ in each column of the first mark patterns 201 may be equal; while pitches of the sub patterns 201$i$ in different columns of the first mark patterns 201 may be different. In one embodiment, the pitches of different columns of sub patterns 201$i$ of the first mark patterns 201 may increase progressively, or decrease progressively. For example, the pitch of the first column of sub patterns 2011 of the first mark patterns 201 may be Pitch_1=110 nm; the pitch of the second column of sub patterns 2012 may be Pitch_2=120 nm; the pitch of the third column of sub patterns 2013 may be Pitch 3=130 nm; . . . ; the pitch of the n$^{th}$ column of sub patterns 201$n$ may be Pitch_n= (100+10 n)nm. In certain other embodiments, the pitches of different columns of sub patterns 201$i$ of the first mark patterns 201 may be adjusted according to different process parameters.

Further, as shown in FIG. 2, the second mark patterns 202 may also include an "n×n" array of sub patterns 202$i$ (wherein "n" is a positive integer). The "n×n" array may refer to a number of "n×n" sub patterns 202 are distributed in "n" rows and "n" columns. Pitches of the sub patterns 202$i$ in each row of the second mark patterns 202 may be equal; while pitches of the sub patterns 202$i$ in different rows of the first mark patterns 202 may be different. In one embodiment, the pitches of different rows of sub patterns 202$i$ of the second mark patterns 202 may increase progressively, or decrease progressively. Further, the pitches of different rows of sub patterns 202$i$ of the second mark patterns 202 may be equal to the pitches of corresponding columns of sub patterns 201 in of the first mark patterns 201. For example, the pitch of the first row of sub patterns 2021 of the second mark patterns 202 may be Pitch_1=110 nm; the pitch of the second row of sub patterns 2022 may be Pitch_2=120 nm; the pitch of the third row of sub patterns 2013 may be Pitch_3=130 nm; . . . ; the pitch of the n$^{th}$ row of sub patterns 201$n$ may be Pitch_n=(100+10 n)nm, which may be equal to the pitch of the corresponding sub patterns 201$n$ of the first mark patterns 201. In certain other embodiments, the pitches of different columns of sub patterns 201$i$ of the first mark patterns 201 may be adjusted according to different process parameters. For illustrative purposes, various numbering methods are used in FIG. 2 to index the sub patterns 201$i$ with different pitches.

Further, as shown in FIG. 2, the first reticle 201 may also have a plurality of global mark patterns 203. The global mark patterns 203 may be formed in scribe lines between the first mark patterns 201 and the second mark patterns 202. The global mark patterns 203 may be used to form global overlay alignment marks in subsequent processes.

Figure 3:
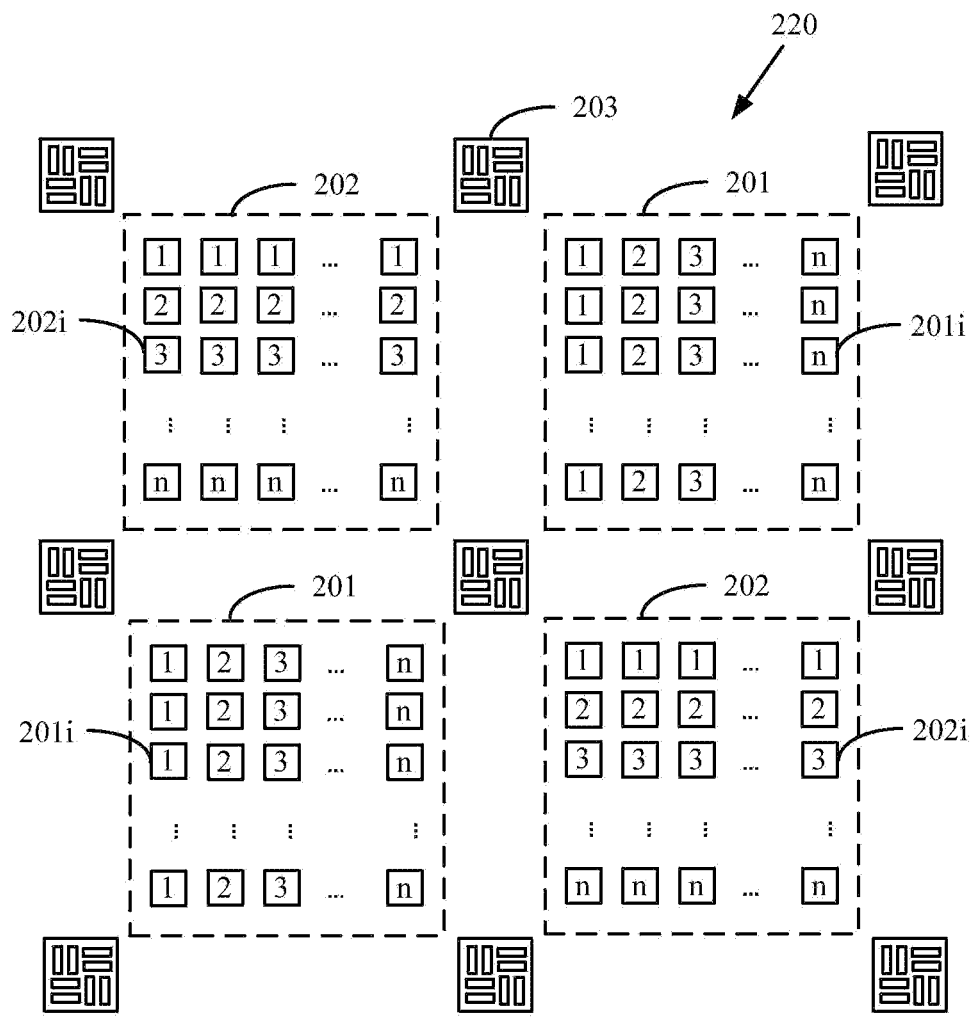
FIG. 3 illustrates a second reticle consistent with the disclosed embodiments.

Returning to FIG. 9, after providing the first reticle, a second reticle with certain structures may be provided (S102). FIG. 3 illustrates a corresponding structure.

As show the FIG. 3, a second reticle 210 is provided. The second reticle 220 may have a plurality of first mark patterns 201 and a plurality of second mark patterns 202. Further, positions of the first mark patterns 201 of the second reticle 220 may correspond to positions of the second mark patterns 202 of the first reticle 210; and positions of the second mark patterns 202 of the second reticle 220 may correspond to positions of the first mark patterns 201 of the first reticle 210.

In one embodiment, the second reticle 220 may include two first mark patterns 201 and two second mark patterns 202. The two first mark patterns 201 and the two second mark patterned may be diagonally distributed. That is, the two first mark patterns 201 may locate at both ends of a first diagonal of an imaginary square; and the two second mark patterns 202 may locate at both ends of the second diagonal of the imaginary square. Specifically, as shown in FIG. 3, positions the two first mark patterns 201 of the second reticle 220 may correspond to positions of the second mark patterns 202 of the first reticle 210. That is, the two first mark patterns 201 of the second reticle 220 locate at the top-right corner and the bottom-left corner of the imaginary square. Further, positions the two second mark patterns 202 of the second reticle 220 may correspond to positions of the first mark patterns of the first reticle 210. That is, the two second mark patterns 202 of the second reticle may locate at the top-left corner and the bottom-right corner of the imaginary square. In certain other embodiments, positions of the first mark patterns 201 and the second mark patterns 202 may be switched.

Bottom overlay alignment marks or top overlay alignment marks may be subsequently formed by the first reticle 210 and the second reticle 220. Because the positions of the first mark patterns 201 of the second reticle 220 may correspond to the positions of the second mark patterns 202 of the first reticle 210; and the positions the second mark patterns of the second reticle 220 may correspond to the positions of the first mark patterns of the first reticle 210, patterns of the bottom overlay alignment marks and patterns of the top overlay alignment marks at a same position may have different pitches; an overlays shift may be obtained. An obtained overlay shift may include an overlay shift caused by a source asymmetry, thus the symmetry (or asymmetry) of the source may be monitored.

Further, as shown in FIG. 3, the second reticle 220 may also have a plurality of global mark patterns 203. The global mark patterns 203 may locate at scribe lines between the first mark patterns 201 and the second mark patterns 202. Further, positions of the global mark patterns 203 of the second reticle 220 may correspond to positions of the global mark patterns 203 of the first reticle 210; and pitches of the global mark patterns 203 of the second reticle 220 may be equal to pitches of the global mark patterns 203 of the first reticle 210.

In certain other embodiments, the number of the first mark patterns 201 and the second mark patterns 202 on the first reticle 210 and the second reticle 220 may be greater than two. For example, the first reticle 210 and the second reticle 220 may have eight or sixteen first mark patterns 201 and eight or sixteen second mark patterns 202. Thus, more overlay marks may be subsequently formed on a wafer. After multiple times of measurements, more reliable overlay shifts caused by a possible source asymmetry may be obtained.

Further, the sub patterns 201$i$ of the first mark patterns 201, the sub patterns 202$i$ of the second mark patterns 202 and the global mark patterns 203 may be concentric alignment detection marks (box-in-box marks). An alignment detection mark may have two independent structure patterns; and the two independent structure patterns may be formed in different process layers. An overlay shift may be measured by measuring a distance of centers of the two independent structure patterns.

Figure 4:
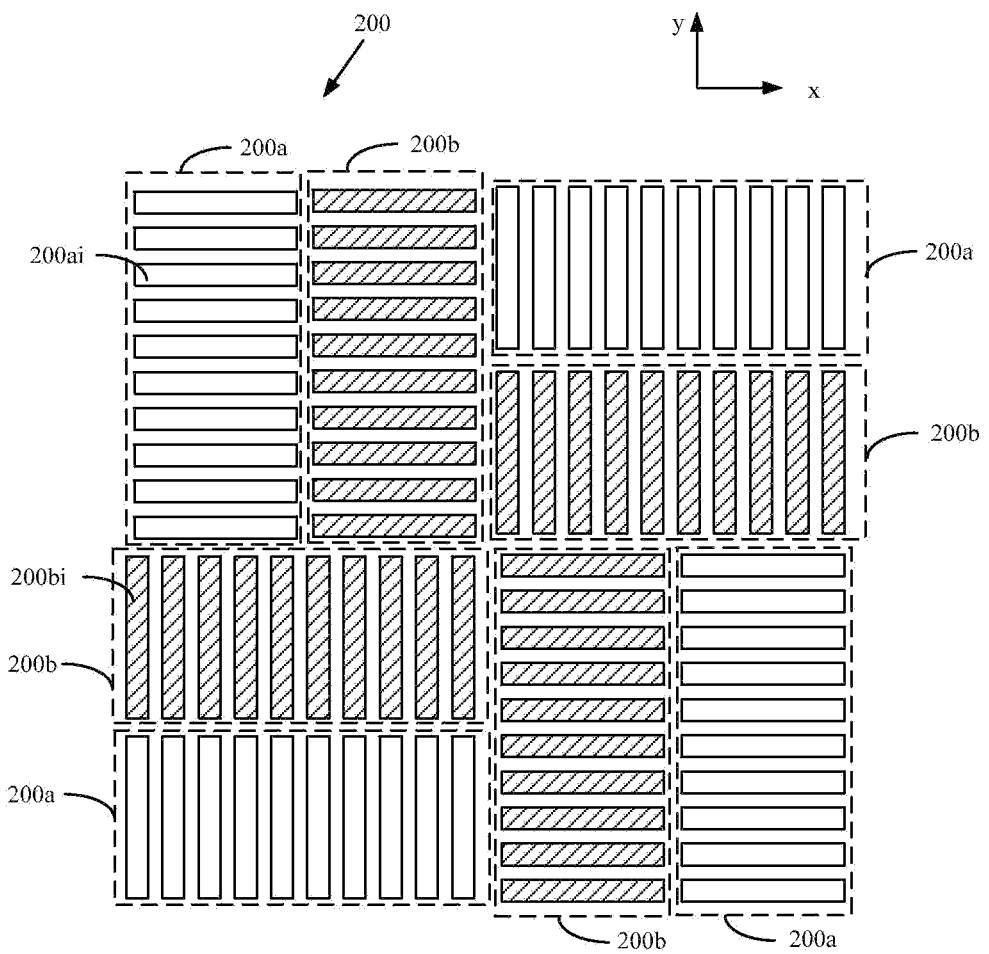
FIG. 4 illustrates an alignment mark consistent with the disclosed embodiments.

FIG. 4 illustrates a top-view of the alignment detection mark. In one embodiment, an advanced imaging metrology (AIM) mark 200 may be used as the alignment detection mark. As shown in FIG. 4, the AIM mark 200 may include four outer periodic structures 200$a$. Two of the four outer periodic structures 200$a$ may have lines 200$ai$ and spaces (not shown) along the "x" direction; and the other two outer periodic structures 200$a$ may have lines 200$i$ and spaces (not shown) along the "y" direction.

Similarly, as shown in FIG. 4, the AIM mark 200 may also have four inner periodic structures 200$b$. Two of the four inner periodic structures 200$b$ may have lines 200$bi$ and spaces (not shown) along the "x" direction; and the other two inner periodic structures 200$b$ may have lines 200$bi$ and spaces (not shown) along the "y" direction.

Figure 5:
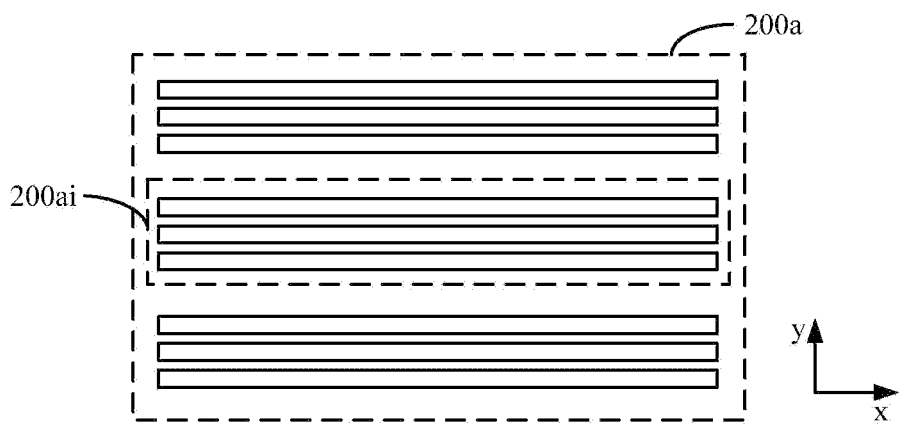
FIG. 5 illustrates outer periodic structures of the alignment mark consistent with the disclosed embodiments.

FIG. 5 illustrates one of the outer periodic structure 200$a$. The lines 200$ai$ of the outer periodic structure 200$a$ may be along the "x" direction; and each of the lines 200$ai$ may be divided into a certain number of periodic structures with a certain pitch along the "y" direction. Correspondingly, each of the lines 200$ai$ of the outer periodic structure 200$a$ along the "y" direction may be divided into a certain number of periodic structures with a certain pitch along the "x" direction. A ratio of the critical dimension and the pitch of the periodic structure may be determined by the optical contrast and the lithography process window of a photolithography system.

Further, each of the lines 200$bi$ of the inner periodic structure 200$b$ along the "x" direction may be divided into a certain number of periodic structures with a certain pitch along the "y" direction. Correspondingly, each of the lines 200$bi$ of the inner periodic structure 200$b$ along the "y" direction may be divided into a certain number of periodic structures with a certain pitch along the "x" direction. Having the periodic structures in the AIM mark 200 may aid the monitoring system to measure small size overlay shifts.

If the sub patterns 201$i$ of the first mark patterns 201 on the first reticle 210 are the outer periodic structures 200$a$, the sub patterns 201$i$ of the first mark patterns 201 on the second reticle 220 may be the corresponding inner periodic structures 200$b$. Similarly, if the sub patterns 201$i$ of the first mark patterns 201 on the first reticle 210 are the inner periodic structures 200$b$, the sub patterns 201$i$ of the first mark patterns 201 on the second reticle 220 may be the corresponding outer periodic structures 200$a$.

Further, if the sub patterns 202$i$ of the second mark patterns 202 on the first reticle 210 are the outer periodic structures 200$a$, the sub patterns 202$i$ of the second mark patterns 202 on the second reticle 220 may be the corresponding inner periodic structures 200$b$. Similarly, if the sub patterns 202$i$ of the second mark patterns 202 on the first reticle 210 are the inner periodic structures 200$b$, the sub patterns 202$i$ of the second mark patterns 202 on the second reticle 220 may be the corresponding outer periodic structures 200$a$.

The outer periodic structures 200$a$ and the inner periodic structures 200$b$ may be used to subsequently form overlay alignment marks in different process layers.

In certain other embodiments, the sub patterns 201$i$ of the first mark patterns 201, the sub patterns 202$i$ of the second mark patterns 202 and the global mark patterns may also use other appropriate concentric alignment detection marks.

Figure 6:
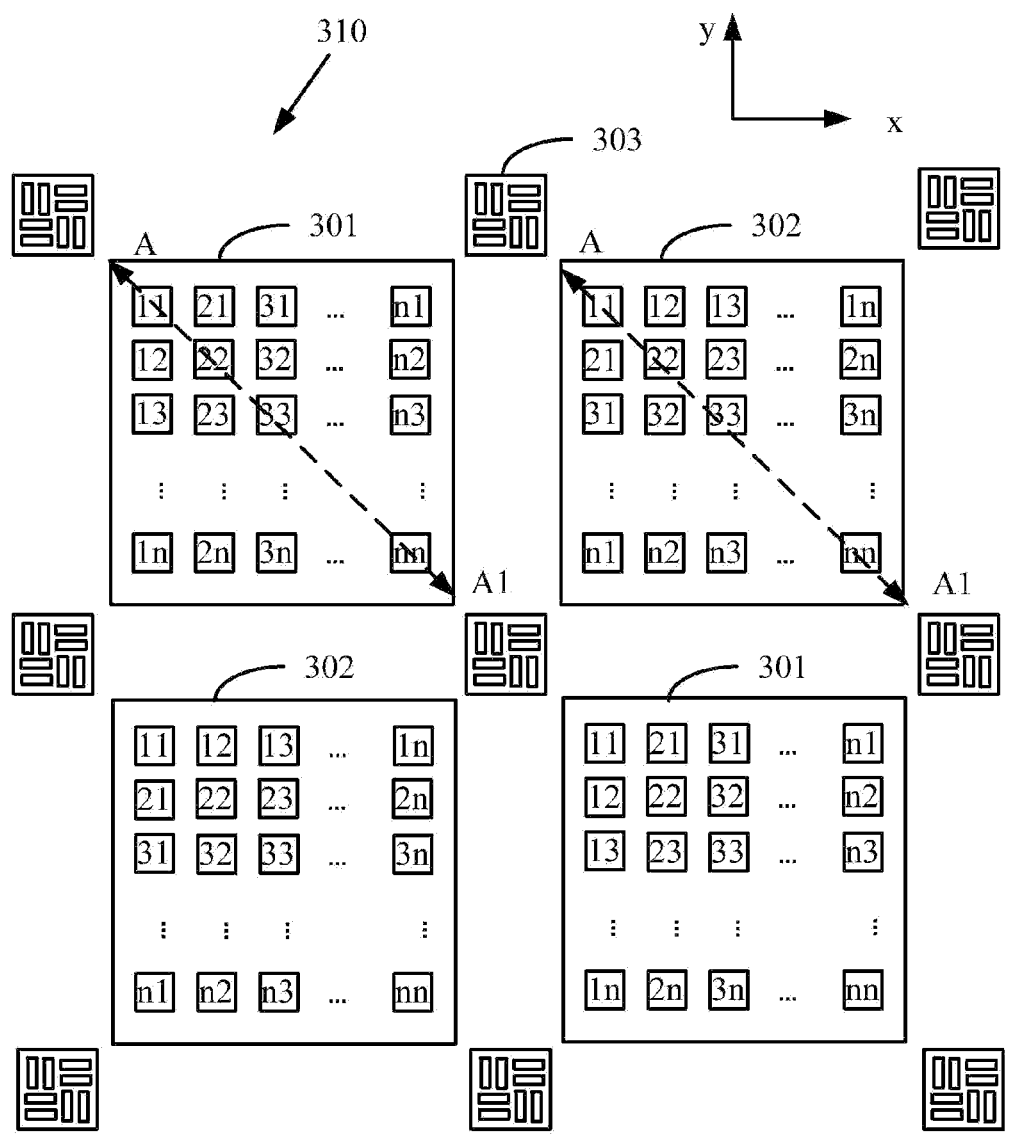
FIG. 6 illustrates a first wafer consistent with the disclosed embodiments.

Returning to FIG. 9, after proving the second reticle 220, a first wafer with certain structures may be provided (S103). FIG. 6 illustrates a corresponding structure.

As shown in FIG. 6, a first wafer 310 is provided. A plurality of first overlay alignment matrixes 301 (may refer to odd matrixes) and a plurality of second overlay alignment matrixes 302 (may refer to even matrixes) may be formed on the first wafer 310.

The first overlay matrixes 301 and the second overlay matrixes 302 may be formed by sequentially forming a plurality of first bottom overlay alignment marks (not shown) on the first wafer 310 and forming a plurality of first top overlay alignment marks (not shown) on the first bottom alignment marks.

A process for forming the first bottom overlay alignment marks on the first wafer 310 may include forming a photoresist layer (not shown) on the first wafer 310; exposing and developing the photoresist layer using the first reticle 210; and etching the first wafer 310 isotropically. Thus, the first bottom overlay alignment marks corresponding to the first reticle 210 may be formed on the first wafer 310. In one embodiment, after forming the first bottom overlay alignment marks, a surface of the first wafer 310 having the first bottom overlay alignment marks may be flattened by a thin film deposition process or a chemical vapor deposition process, etc.

Further, after forming the first bottom overlay alignment marks, the first top overlay alignment marks (not shown) may be formed on the first bottom alignment marks using the second reticle 220. A process for forming the first top overlay alignment mark may include spin coating a photoresist layer (not shown); exposing and developing the photoresist layer using the second reticle; and etching the first substrate 310 isotropically. Thus, the first top overlay alignment marks may be formed on the first bottom overlay alignment marks.

The first bottom overlay marks on the first wafer 310 may be formed by the first reticle 210; and the first top overlay marks on the first wafer 310 may be formed by the second reticle 220. Further, the positions of the first mark patterns 201 on the second reticle 220 may correspond to the positions of the second mark patterns 202 on the first reticle 210; and the positions of the second mark patterns 202 of the second reticle 220 may correspond to the positions of the first mark patterns 201 on the first reticle 210. Therefore, as shown in FIG. 6, after two times of exposure (forming the first bottom overlay alignment marks and forming the first top overlay marks), the first overlay alignment matrixes 301 and the corresponding second overlay alignment matrixes 302 may be formed on the first wafer 310. The first bottom overlay alignment marks on the first overlay alignment matrixes 301 may correspond to the first mark patterns 201; and the first top overlay alignment marks of the first overlay alignment matrixes 301 may correspond to the second reticle patterns 202. The first bottom overlay alignment marks of the second overlay alignment matrixes 302 may correspond to the second mark patterns 202; and the first top overlay alignment marks of the second overlay alignment matrixes 302 may correspond to the first mark patterns 201.

Further, since the pitches of every row of sub patterns of the second mark patterns 202 may be equal to the pitches of every column of the sub patterns of the first mark patterns 201, as shown in FIG. 6, pitches of the first bottom overlay alignment marks on the diagonal AA1 of the first overlay alignment matrixes 301 and the diagonal of second overlay alignment matrixes 302 may be equal to pitches of the first top overlay alignment marks on the diagonal AA1 of the first overlay alignment matrixes 301 and the diagonal of second overlay alignment matrixes 302, while pitches of the first bottom overlay alignment marks and the pitches of the first top alignment marks at other positions of the first overlay alignment matrixes 301 and the second overlay alignment matrixes 302 may be different. Further, the pitches and sized of the overlayer marks may be smaller than the wavelength of the exposure light, and the marks are segmented. Thus, the overlay marks may be referred as unbalanced sub-optical resolution overlay marks.

As shown in FIG. 6, for illustrative purposes, the first bottom overlay marks and the first top overlay alignment marks with different pitches of the first overlay alignment matrixes 301 and the second overlay alignment matrixes 302 on the first wafer 310 are indexed using numbers.

Figure 7:
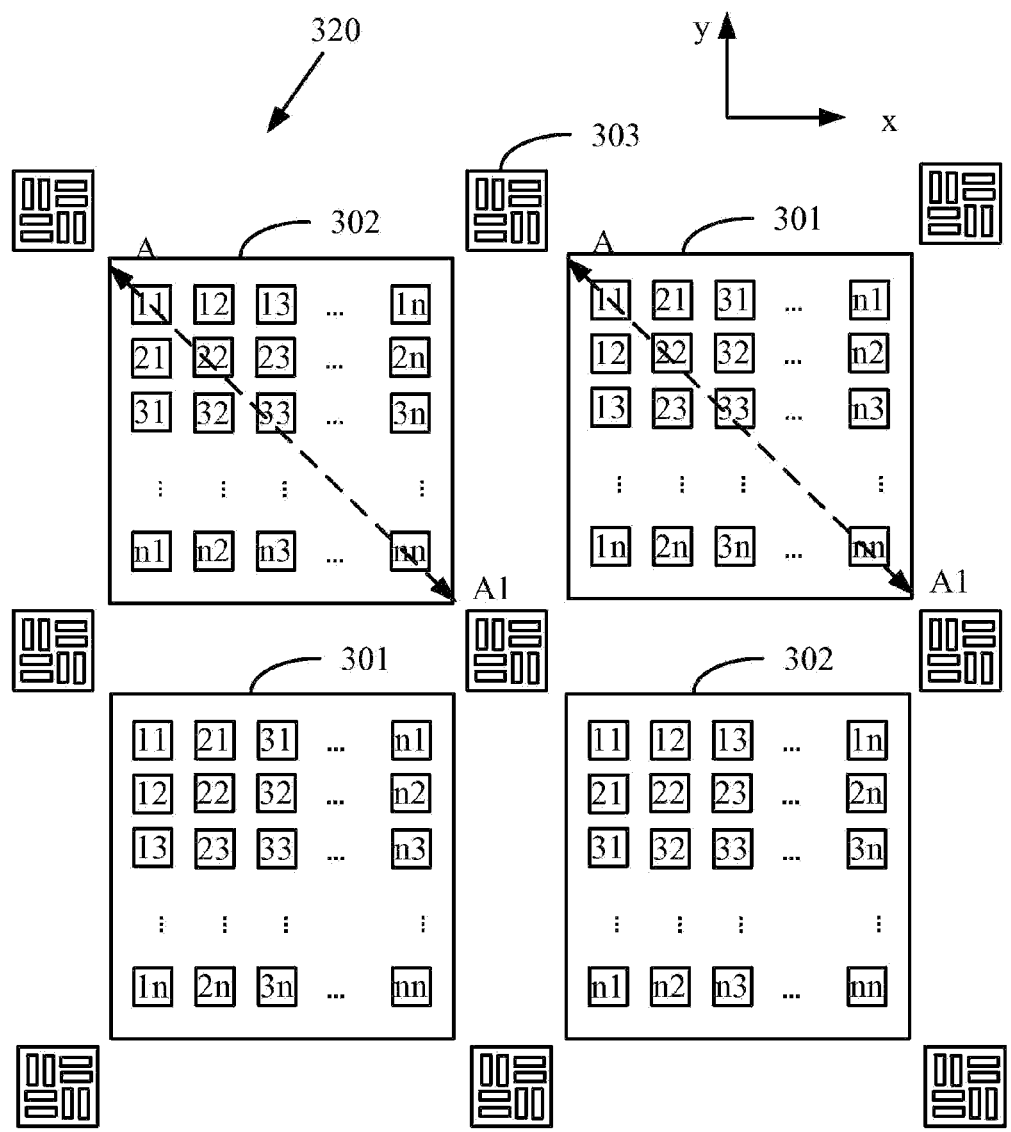
FIG. 7 illustrates a second wafer consistent with the disclosed embodiment.

Returning to FIG. 9, after proving first wafer 310, a second wafer with certain structures may be provided (S104). FIG. 7 illustrates a corresponding structure.

As shown in FIG. 7, a second wafer 320 is provided. A plurality of first overlay alignment matrixes 301 and a plurality of second overlay alignment matrixes 302 may be formed on the second wafer 320.

The first overlay matrixes 301 and the second overlay matrixes 302 may be formed by sequentially forming a plurality of second bottom overlay alignment marks (not shown) on the second wafer 320 and forming a plurality of second top overlay alignment marks (not shown) on the second bottom alignment marks.

A process for forming the second bottom overlay alignment marks on the second wafer 320 may include forming a photoresist layer (not shown) on the second wafer 320; exposing and developing the photoresist layer using the second reticle 220; and etching the second wafer 320 isotropically. Thus, the second bottom overlay alignment marks corresponding to the second reticle 220 may be formed on the second wafer 320. In one embodiment, after forming the second bottom overlay alignment marks, a surface of the second wafer 320 having the second bottom overlay alignment marks may be flattened by a thin film deposition process or a chemical vapor deposition process, etc.

Further, after forming the second bottom overlay alignment marks, the second top overlay alignment marks (not shown) may be formed on the second bottom alignment marks using the first reticle 210. A process for forming the second top overlay alignment marks may include spin coating a photo resist layer (not shown); exposing and developing the photo resist layer using the first reticle 210, and etching the second substrate 320 isotropically. Thus, the second top overlay alignment marks may be formed on the second bottom overlay alignment marks.

The second bottom overlay marks on the second wafer 320 may be formed by the second reticle 220; and the second top overlay marks on the second wafer 320 may be formed by the first reticle 210. Thus, positions of the second overlay alignment matrixes 302 on the second wafer 320 may correspond to the positions of the first overlay alignment matrixes 301 on the first wafer 310; and positions of the first overlay alignment matrixes 301 on the second wafer 320 may correspond to the positions of the second overlay alignment matrixes 302 on the first wafer 310.

Similarly, as shown in FIG. 7, pitches of the second bottom overlay alignment marks on the diagonal AA1 of the first overlay alignment matrixes 301 and the diagonal of second overlay alignment matrixes 302 on the second wafer 320 may be equal to pitches of the second top overlay alignment marks on the diagonal AA1 of the first overlay alignment matrixes 301 and the diagonal of second overlay alignment matrixes 302 on the second wafer 320, while pitches of the second bottom overlay alignment marks and the pitches of the second top overlay alignment marks at other positions of the first overlay alignment matrixes 301 and the second overlay alignment matrixes 302 on the second wafer 320 may be different.

As shown in FIG. 7, for illustrative purposes, the second bottom overlay marks and the second top overlay marks with different pitches of the first overlay alignment matrixes 301 and the second overlay alignment matrixes 302 on the second wafer 320 are indexed using numbers.

Further, as shown in FIG. 7, the second wafer 320 may also have a plurality of global mark patterns 303. The global mark patterns 303 may be formed by global bottom overlay alignment marks and global top overlay alignment marks.

Referring to FIG. 2 and FIG. 3, the first reticle 210 and the second reticle 220 may both have the global mark patterns 203. The global mark patterns 203 may locate in the scribe lines of the first mark patterns 201 and the second mark patterns 202. Therefore, when the first bottom overlay alignment marks and the second bottom overlay alignment marks are formed, the global bottom alignment marks may be formed in scribes lines of the first wafer 310 and the second wafer 320. Further, when the first top overlay alignment marks and the second top overlay alignment marks are formed, the global top overlay alignment marks may be formed on the global bottom alignment marks. Because the global mark patterns 203 on the first reticle 210 may correspond to the global mark patterns 203 on the second reticle 220; and the pitches of the global mark patterns 203 on the first reticle 210 may be equal to the pitches of the global mark patterns 203 on the second reticle 220, pitches of the global bottom overlay alignment marks may be equal to pitches of the global top overlay alignment marks. Therefore, the global bottom overlay alignment marks and the global top overlay alignment marks may form the global alignment marks 303 on the scribe lines of the first wafer 310 and the second wafer 320.

Returning to FIG. 9, after forming the first bottom overlay alignment marks and the first top overlay alignment marks on the first wafer 310; and the second bottom overlay alignment marks and the second top overlay alignment marks on the second wafer 320, a first overlay shift and a second overlay shift may be measured (S105).

Specifically, a first overlay shift between the first top overlay alignment marks and the first bottom overlay alignment marks on the first wafer 310 may be measured by an overlay shift measurement system. Further, a second overlay shift between the second top overlay alignment marks and the second bottom overlay alignment marks on the second wafer 320 may also be measured by the overlay shift measurement system.

Figure 8:
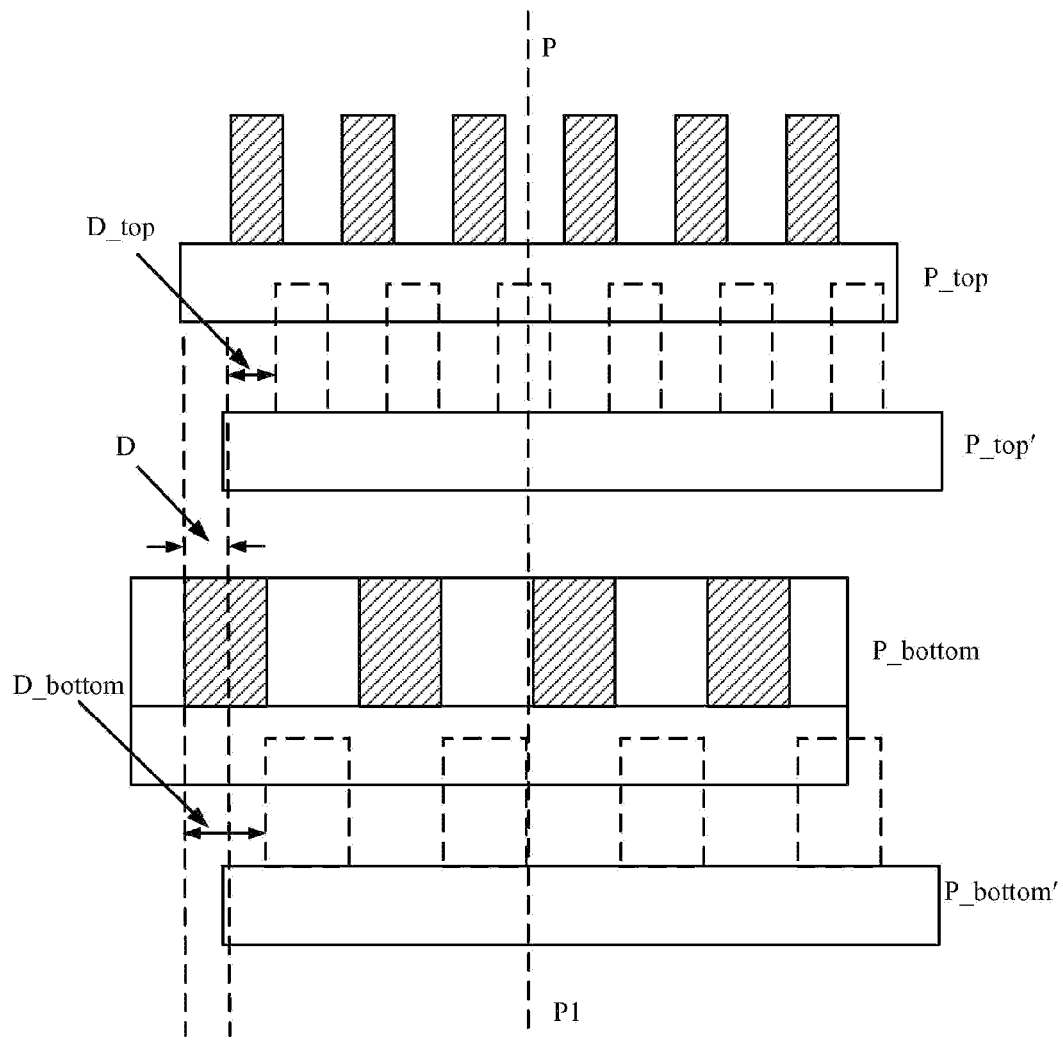
FIG. 8 illustrates an overlay drift consistent with the disclosed embodiments.

FIG. 8 illustrates top overlay alignment marks P_top with different pitches and bottom overlay alignment marks P_bottom with different pitches having an overlay drift. The top overlay alignment marks P_top and the bottom alignment marks P_bottom may correspond to the line 201ai of the outer periodic structures 200a or the inner periodic structures 200bi shown in FIG. 5, respectively. P_top' and P_bottom' may refer to positions of the top overlay alignment marks P_top and the bottom overlay alignment marks P_bottom without overlay drift at ideal conditions. The central position of P_top and the central position of P_bottom may be aligned at an ideal position PP'.

However, due to effects of the photolithography system, the quality of the reticles, and the source asymmetry, an overlay drift may exist between the top overlay alignment marks P_top and the bottom overlay alignment marks P_bottom. As shown in FIG. 8, D_top may refer to a shift between the positions of the top overlay alignment marks P_top and the positions of P_top' at ideal conditions; and D_bottom may refer to a shift between the positions of the bottom overlay alignment marks P_bottom and the positions of P_bottom' at ideal conditions. Referring to FIG. 8, an overlay shift D may refer to a difference between D_top and D_bottom; and the overlay shift D may indicate an shift between the center of the top overlay alignment marks and the center of the bottom alignment marks. In a semiconductor manufacturing process, the overlay shift D may be measured by overlay shift measurement apparatuses.

In one embodiment, a first overlay shift D1(i, j) of the first top overlay alignment marks and the first bottom overlay alignment marks on the first wafer 310 may be measured. The first overlay shift D1(i, j) may include a component D1x(i, j) along the x axis, and a component D1y(i, j) along the y axis. Further, a second overlay shift D2(i, j) of the second top overlay alignment marks and the bottom overlay alignment marks on the second wafer 320 may also be measured. The second overlay shift D2(i, j) may also include a component D2x(i, j) along the x direction and a component D2y(i, j) along the y direction. Wherein: $1 \leq i \leq n$ and $0 \leq j \leq n$, i refers to a row number of the first overlay alignment matrixes 301 and a row number of the second overlay alignment matrixes 302; j refers to a column number of the first overlay alignment matrixes 301 and a column number of the second overlay alignment matrixes 302; and n may refer to a total row number or a total column number of the first overlay alignment matrixes 301 and the second overlay alignment matrixes 302. Because the pitches of bottom overlay alignment marks on the diagonals AA1 of the first overlay alignment matrixes 301 and the second overlay alignment matrixes 302 may be equal to the pitches of the top overlay alignment marks on the diagonals AA1 of the first overlay alignment matrixes 301 and the second overlay alignment matrixes 302; and overlay shifts caused by a source asymmetry may be independent of the pitches of patterns, when i=j, D1(i, j) and D2(i, j) may contain no overlay shifts caused by the source asymmetry; and when i≠j, D1(i, j) and the D2 (i, j) may contain overlay shifts caused by the source asymmetry.

The scribe lines of the first wafer 310 and the second wafer 320 may have the global overlay alignment marks 303, when the first overlay shift D1(i, j) and the second overlay shift D2(i, j) are measured, a global overlay shift of the global overlay alignment marks 303 may also be measured. Because the pitches of the global bottom alignment marks of the global overlay alignment marks may be equal to the pitches of the global top alignment marks of the global overlay alignment marks, the obtained global overlay shift may contain no overlay shift caused by the source asymmetry.

Returning to FIG. 9, after obtaining the first overlay shift D1(i, j) of the first wafer 310, the second overlay shift D2 (i, j) of the second wafer 320 and the global overlay shift, a data processing may be performed to the first overlay shift D1(i, j) of the first wafer 310, the second overlay shift D2(i, j), thus an overlay shift caused by the source asymmetry may be calculated (S106).

Firstly, a tool induced shift (TIS) caused by the overlay shift measurement system may be subtracted from the first overlay shift D1(i, j) and the second overlay shift D2(i, j). The TIS caused by the overlay shift measurement system may refer to measurement errors of the overlay measurement system. The measure errors of the overlay measurement system may cause the first overlay shift D1 (i, j) and the second overlay shift D2 (i, j) to have errors, thus the measurement errors caused by the overlay shift measurement system may need to be subtracted.

Then, a polynomial fitting may be performed on the overlay shifts for i=j of the first overlay shift D1(i, j) of the first wafer 310 and the second overlay shift D2(i, j) of the second wafer 320, that is, an overlay drift of the first overlay drift and the second overlay drift obtained by measuring the top over alignment marks and the bottom overlay alignment marks having equal pitches on the diagonals AA1, and the global overlay shift of the first wafer 310 and the second wafer 320, thus an overlay shift caused by the photolithography system may be obtained.

Because the overlay shift of the position of D1(i, j) with i=j and the position of D2(i, j) with i=j may be independent of the source asymmetry, while the overlay shift caused by the photolithography system may be described by polynome, thus after the polynomial fitting using the overlay shift of the position of D1(i, j) with i=j, the position of D2(i, j) with i=j and the global overlay shift, an overlay shift error of the position of D1(i, j) with i≠j and the position of D2(i, j) with i≠j caused by the photolithography system may be obtained. The overlay shift obtained by the polynomial fitting caused by the photolithography system may be subtracted from the D1(i, j) and the D2(i, j), the leftover D1(i, j) and the D2(i, j) may only contain an overlay shift unable to be described by polynome, and an overlay shift caused by the source asymmetry.

In certain other embodiments, if the global overlay marks are not formed on the first wafer 310 and the second wafer 320, an over shift obtained by measuring the top overlay marks and the bottom overlay marks with same pitches from the first overlay shift and the second overlay shift may be used to do a polynomial fitting, and an overlay shift caused by a photolithography system may be obtained. Then, the overlay shift caused by the photolithography system may be subtracted from the first overlay shift and the second overlay shift; and the result may only contain an overlay shift unable to be described by polynome, and an overlay shift caused by the source asymmetry Further, an overlay shift caused by a reticle may be subtracted from the first overlay shift D1(i, j) and the second overlay shift D2(i, j). The overlay shift caused by the reticle may be generated by heating the reticle during a photolithography, and may be referred as high order intrafield errors. Patterns on the reticle may be changed by the heat. The overly shift caused by the reticle may be random, and may be unable to be describe by polynome. By calculating one half of the difference by the first overlay shift D1(i, j) obtained on the first wafer 310 and the second overlay shift obtained on the second wafer 320, that is, [D1(i, j)-D2(i, j)]/2, the overlay shift caused by the reticle in D1(i, j) and D2(i, j) may be removed.

Further, an overlay shift caused by a fabrication of the reticle may be subtracted from the first overlay shift D1(i, j) and the second overlay shift D2(i, j). Because the reticle may be often fabricated by an e-beam lithography process, different pattern densities at different positions on the reticle or different pattern pitches may cause subsequently formed patterns to have differences, thus an overlay shift may be generated. The overlay shift caused by the fabrication of the reticle may be removed by calculating one half of an overlay drift difference between adjacent overlay alignment matrixes. For example, The overlay shift caused by the fabrication of the reticle may be removed by calculating one half of the overlay shift difference between [D1(i, j)-D2(i, j)]/2 corresponding to the first overlay alignment matrixes 301 and [D1(i, j)'-D2(i, j)']/2 corresponding to the adjacent second overlay alignment matrixes 302. After removing the overlay shift caused by the fabrication of the reticle from the first overlay shift D1(i, j) and the second overlay shift D2(i, j), the resulted overlay shift may be the overlay shift caused by the source asymmetry.

After obtaining the overlay shift caused by the source asymmetry by a serial calculations, the overlay shift caused by the source asymmetry may be compared with a threshold value. The threshold value of the overlay shift caused by the source asymmetry may be decided by a certain process requirement to ensure that the overlay shift caused by the source asymmetry may be in an acceptable region. If the overlay shift caused by the source asymmetry is greater than the threshold value, the source of the photolithography system may need to be calibrated to reduce or eliminate the overlay shift caused by the source asymmetry. If the overlay shift caused by the source asymmetry is smaller than the threshold value, the source symmetry may be in the acceptable region, it may be unnecessary to calibrate the source of the photolithography system.

Because the source asymmetry may be monitored by forming unbalanced sub-optical-resolution overlay alignment marks on wafers; measuring the overlay shifts; obtaining the overlay shift induced by the source (pupil) asymmetry by a data processing of the overlay shifts; and comparing the over shift caused by the source asymmetry to a threshold value, the method for monitoring the source asymmetry of the photolithography system may be an online method. Therefore, the monitoring of the source asymmetry may be performed during a normal photolithography manufacturing process. The monitoring method may be simple, and may be unnecessary to interrupt the normal manufacturing process.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for monitoring a source symmetry of a photolithography system, comprising:
   providing a first reticle having a plurality of first mark patterns and a plurality of second mark patterns;
   providing a second reticle also having a plurality of the first mark patterns and a plurality of the second mark patterns;
   forming first bottom overlay alignment marks on a first wafer using the first reticle;
   forming first top overlay alignment marks on the first bottom overlay alignment marks using the second reticle;
   forming second bottom overlay alignment marks on a second wafer using the second reticle;
   forming second top overlay alignment marks on the second bottom overlay alignment marks using the first reticle;
   measuring a first overlay shift of the first top overlay alignment marks and the first bottom overlay alignment marks;
   measuring a second overlay shift of the second top overlay alignment marks and the second bottom overlay alignment marks; and
   obtaining an overlay shift caused by the source asymmetry based on the first overlay shift and the second overlay shift.

2. The method according to claim 1, wherein:
   positions of the first mark patterns on the second reticle correspond to positions of the second mark patterns on the first reticle; and
   positions of the second mark patterns on the second reticle correspond to positions of the first mark patterns on the first reticle.

3. The method according to claim 1, wherein:
   the first mark patterns and the second mark patterns have a plurality of sub patterns aligning with rows and columns; and
   pitches of each rows of the sub patterns of the second mark patterns are equal to pitches of each columns of the sub patterns of the first mark patterns.

4. The method according to claim 3, wherein:
   pitches of the sub patterns of each column of the first mark patterns are equal.

5. The method according to claim 3, wherein:
   pitches of each column of sub patterns of first sub patterns increase progressively, or decrease progressively.

6. The method according to claim 3, wherein:
   pitches of the sub patterns of each column of the second mark patterns are equal.

7. The method according to claim 3, wherein:
   pitches of each column of sub patterns of second sub patterns increase progressively, or decrease progressively.

8. The method according to claim 1, wherein:
   the first reticle has two first mark patterns and two second mark patterns;
   the two first mark patterns locate at both ends of one diagonal of an imaginary square; and
   the two second mark patterns locate at both end of the other diagonal of the imaginary square.

9. The method according to claim 1, wherein:
   the second reticle has two first mark patterns and two second mark patterns;
   the two first mark patterns locate at both ends of one diagonal of an imaginary square; and
   the two second mark patterns locate at both end of the other diagonal of the imaginary square.

10. The method according to claim 1, wherein performing data processing to the first overlay shift and the second overlay shift further includes:
   subtracting an overlay shift caused by an overlay shift measurement system from the first overlay shift and the second overlay shift;
   subtracting an overlay shift caused by the photolithography system from the first overlay shift and the second overlay shift; subtracting an overlay shift caused by a reticle from the first overlay shift and the second overlay shift; and
   subtracting an overlay shift caused by a fabrication of the reticle from the first overlay shift and the second overlay shift.

11. The method according to claim 10, wherein subtracting an overlay shift caused by the photolithography system from the first overlay shift and the second overlay shift further includes:
   obtaining the overlay shift caused by the photolithography system by polynomial fitting an overlay shift obtained by measuring top overlay alignment marks and bottom alignment marks with same pitches of the first overlay shift and the second overlay shift; and
   subtracting the overlay shift caused by the photolithography system from the first overlay shift and the second overlay shift.

12. The method according to claim 10, wherein subtracting an overlay shift caused by a reticle from the first overlay shift and the second overlay shift further includes:
   calculating one half of a difference between the first overlay shift and the second overlay shift; and
   subtracting the one half of the difference between the first overlay shift and the second overlay shift from the first overlay shift and the second overlay shift.

13. The method according to claim 10, wherein subtracting an overlay shift caused by a fabrication of the reticle from the first overlay shift and the second overlay shift further includes:
   calculating one half of a difference between adjacent overlay alignment matrixes; and
   subtracting the one half of a difference between adjacent overlay alignment matrixes from the first overlay shift and the second overlay shift.

14. The method according to claim 1, wherein:
   the first reticle and the second reticle have a plurality of global mark patterns; and
   the first wafer and the second wafer have a plurality of global bottom overlay alignment marks and a plurality of global top overlay alignment marks.

15. The method according to claim 14, wherein:
   the global top overlay alignment marks and the global bottom alignment marks are formed in scribe lines in the first wafer and the second wafer; and
   the global top overlay alignment marks on the top of the global bottom alignment marks.

16. The method according to claim 14, wherein:
   pitches of the global top overlay alignment marks are equal to pitches of the global bottom overlay alignment marks.

17. The method according to claim 1, further including:
   measuring an global overlay drift of the global top overlay alignment marks and the global bottom overlay alignment marks.

18. The method according to claim 17, wherein performing data processing to the first overlay shift and the second overlay shift further includes:
   obtaining an overlay shift caused by the photolithography system by polynomial fitting the global overlay drift and the overlay shift obtained by measuring top overlay alignment marks and bottom alignment marks with same pitches of the first overlay shift and the second overlay shift; and
   subtracting the overlay shift caused by the photolithography system from the first overlay shift and the second overlay shift.

19. The method according to claim 1, after obtaining an overlay shift caused by the source asymmetry, further including:
   comparing the overlay shift caused by the source asymmetry with a threshold value;
   calibrating the source of the photolithography system if the overlay shift caused by source asymmetry is greater than the threshold value; and
   keeping settings of the source of the photolithography system if the overlay shift caused by the source asymmetry is smaller than the threshold value.

20. The method according to claim 1, wherein:
   the first marks patterns and the second marks patterns are advanced imaging metrology marks.

* * * * *